(12) United States Patent
Yang et al.

(10) Patent No.: US 11,211,549 B1
(45) Date of Patent: Dec. 28, 2021

(54) INTEGRATED CIRCUIT AND METHOD FOR MANUFACTURING THE SAME

(71) Applicant: TAIWAN SEMICONDUCTOR MANUFACTURING COMPANY LTD., Hsinchu (TW)

(72) Inventors: Chang-Lin Yang, Hsinchu (TW); Chung-Te Lin, Tainan (TW); Han-Ting Tsai, Kaoshiung (TW); Chien-Hua Huang, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/932,639

(22) Filed: Jul. 17, 2020

(51) Int. Cl.
*H01L 43/02* (2006.01)
*H01L 43/12* (2006.01)
*H01L 27/22* (2006.01)

(52) U.S. Cl.
CPC ............ *H01L 43/02* (2013.01); *H01L 27/228* (2013.01); *H01L 43/12* (2013.01)

(58) Field of Classification Search
CPC ........ H01L 43/02; H01L 43/12; H01L 27/228
USPC ......................................................... 257/427
See application file for complete search history.

(56) References Cited

U.S. PATENT DOCUMENTS 10,833,257 B1 * 11/2020 Dutta .................. H01L 27/1222
11,088,323 B2 * 8/2021 Chou .................. H01L 45/1233

* cited by examiner

*Primary Examiner* — Tu-Tu V Ho
(74) *Attorney, Agent, or Firm* — WPAT, P.C., Intellectual Property Attorneys; Anthony King

(57) ABSTRACT

An integrated circuit includes a substrate, a dielectric layer over the substrate, a plurality of cells, a plurality of spacers and a plurality of conductive particles. Each of the cells includes a bottom portion in the dielectric layer and an upper portion protruding from the dielectric layer. The spacers are disposed over the dielectric layer and partially cover the upper portions of the cells, respectively. The spacers are disconnected from each other, and cover a first area of the dielectric layer and expose a second area of the dielectric layer. The conductive particles are disposed between the first area of the dielectric layer and the spacers.

20 Claims, 12 Drawing Sheets

INTEGRATED CIRCUIT AND METHOD FOR MANUFACTURING THE SAME

BACKGROUND

Magnetoresistive random access memory (MRAM) is advantageous for its non-volatility, near-zero standby energy and high density. During the manufacturing of MRAM, undesired electrical leakage between MRAM cells may occur, which is detrimental to the electrical performance of the final memory integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
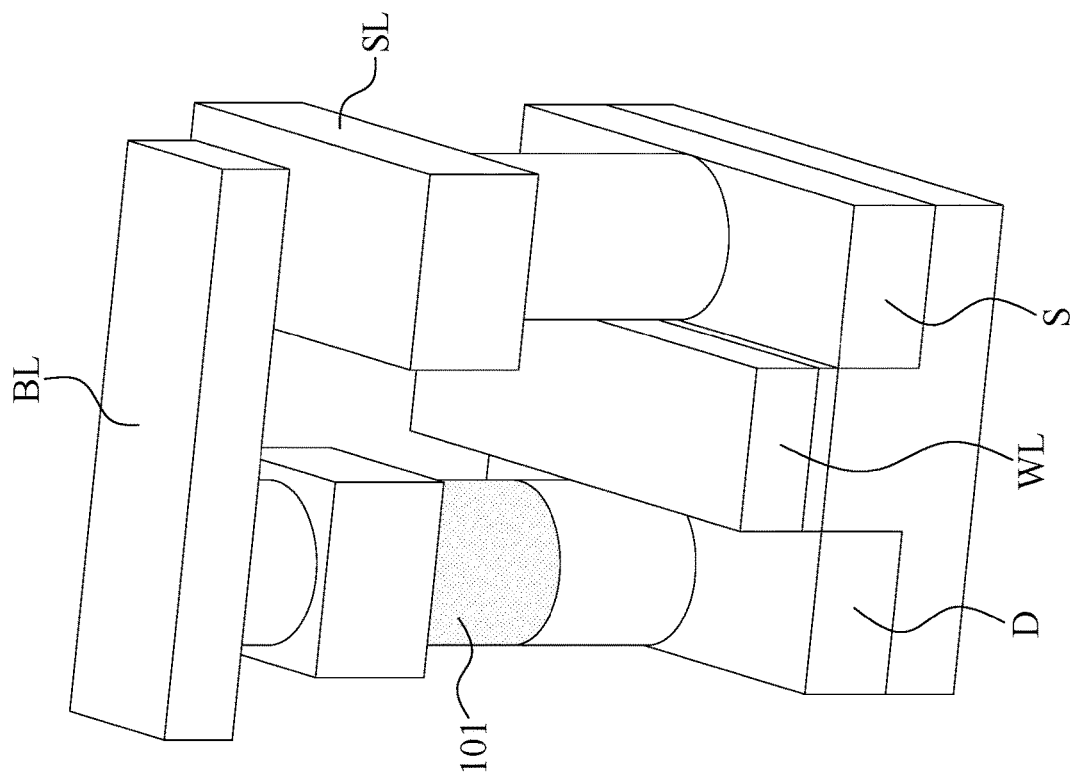
FIG. 2 shows a schematic view of the MRAM device of FIG. 1 in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
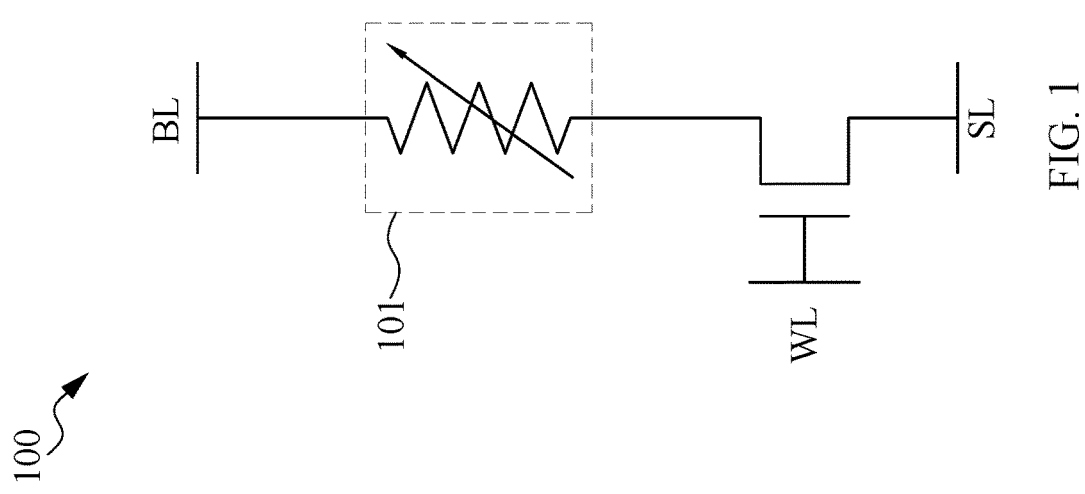
FIG. 1 illustrates a schematic equivalent circuit diagram of an MRAM device in accordance with some embodiments of the present disclosure.

Referring to FIG. 1 and FIG. 2, FIG. 1 illustrates an equivalent circuit diagram of an MRAM device in accordance with some embodiments of the present disclosure and FIG. 2 illustrates a schematic view of the MRAM device of FIG. 1 in accordance with some embodiments of the present disclosure. The MRAM device 100 includes a magnetic tunnel junction (MTJ) 101, a bit line BL, a source line SL, and a transistor including a source region S, a drain region D and a gate electrically connected to a word line WL. The MTJ 101 is connected to a bit line BL and the transistor at its drain region D. The source line SL is connected to the transistor at its source region S. The MTJ 101 may include two ferromagnetic layers sandwiching an insulating barrier layer ("tunnel barrier") (not shown in FIG. 1 or FIG. 2). When the insulating barrier layer is very thin, quantum mechanical tunneling of electrons through the insulating barrier layer makes the MTJ 101 behave like a resistor having a resistance that depends exponentially on the tunnel insulating barrier layer thickness and is proportional to the inverse of the in-plane insulating barrier layer area. The tunneling current is spin-polarized, due to the asymmetric band structure of the ferromagnetic layers, giving rise to the tunneling magnetoresistance. The MTJ 101 thus receives signal in the form of a current and output signal in the form of resistance. For example, when a current flows from the bit line BL to the MTJ 101, the MTJ 101 is at low resistance state ("0"). When a current flows from the source line SL to the MTJ 101, the MTJ is at high resistance state ("1").

The process flow for fabricating an integrated circuit with embedded MRAM cells includes various layer-forming operations and patterning operations. In some embodiments, the layer-forming operations include forming a bottom electrode layer, a top electrode layer, a first ferromagnetic ("FM") layer, a second FM layer, and an insulating barrier layer between the first FM layer and the second FM layer on a substrate. The patterning operations include photolithography operations and etching operations to define the MRAM cell patterns and form the structures of the MRAM cells.

Examples of etching may include reactive ion etching ("RIE"), ion beam etching ("IBE"), and atomic layer etching ("ALE"). RIE is one kind of dry etching which uses chemically reactive plasma to remove material formed on a substrate (e.g. wafers). The chemically reactive plasma with high-energy ions is generated under low pressure by an electromagnetic field. The high-energy ions from the plasma attack the surface of the material and react with it. IBE uses a beam of positive charged ions, e.g. $Ar^+$, to physically etch material from a substrate, such as wafer, by ion bombardment. ALE pertains to a technique using sequential reaction operations that are self-limiting to remove only the top atomic layers of the substrate. Growing demand for smaller and thinner electronic devices with more functions leads to development of an integrated circuit with more densely-packed MRAM cell array. However, when the MRAM cells are designed to be densely-packed, during the etching operations for patterning the MRAM cell structures, side effects such as metal re-deposition between the MTJ pillars occur.

Metal re-deposition leads to cell-to-cell leakage between neighboring MRAM cells, and results in yield degradation and decreased reliability.

Figure 3:
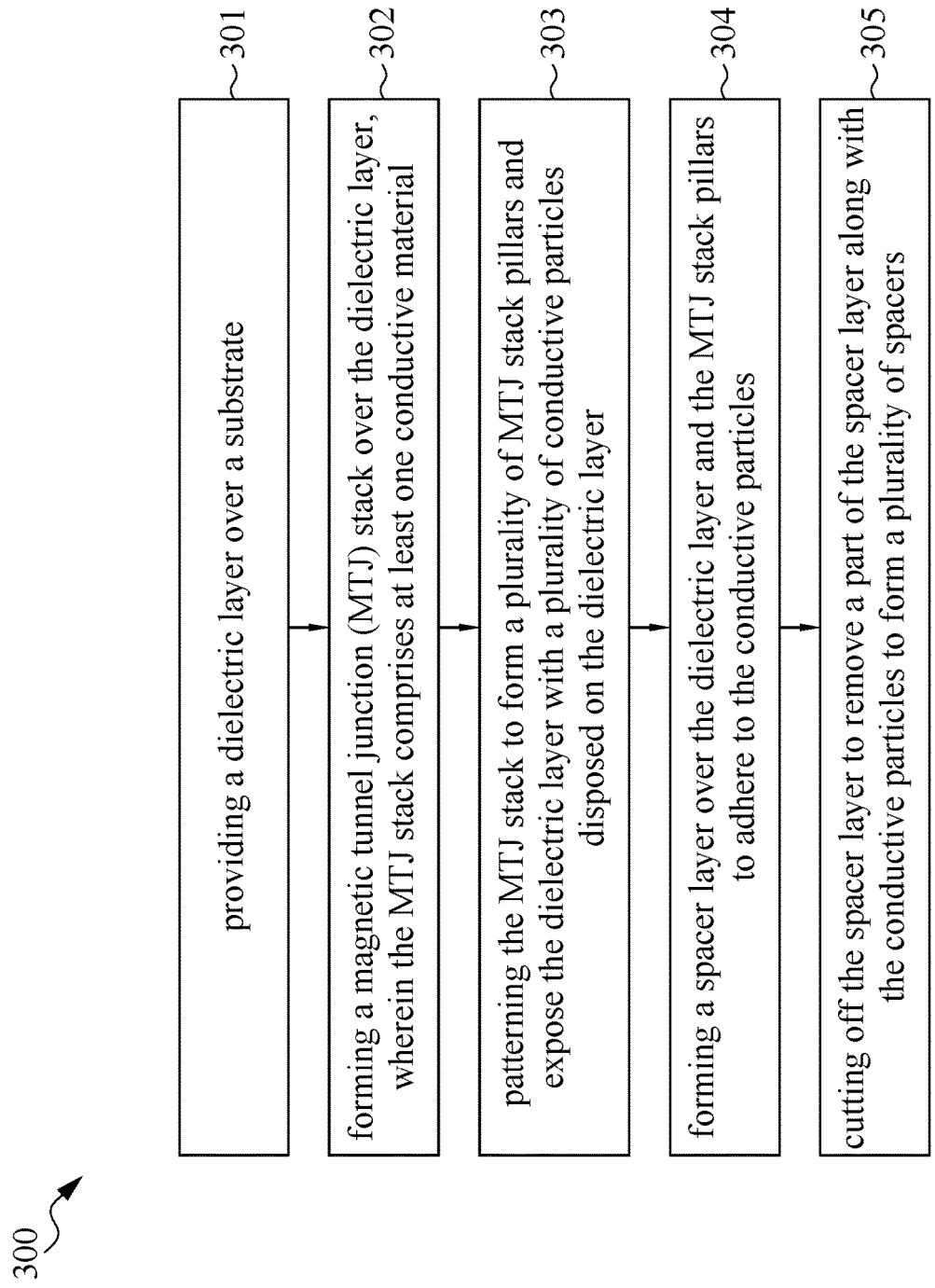
FIG. 3 shows a flowchart of a method of fabricating a magnetoresistive random-access memory (MRAM) device in accordance with some embodiments of the present disclosure.

Referring to FIG. 3, FIG. 3 illustrates a flowchart of a method of fabricating a magnetoresistive random-access memory (MRAM) device in accordance with some embodiments of the present disclosure. The method 300 begins with operation 301 in which a dielectric layer is provided over a substrate. The method 300 proceeds with operation 302 in which a magnetic tunnel junction (MTJ) stack is formed over the dielectric layer. The MTJ stack includes at least one conductive material. The method 300 proceeds with operation 303 in which the MTJ stack is patterned to form a plurality of MTJ stack pillars and expose the dielectric layer with a plurality of conductive particles disposed on the dielectric layer. The method 300 proceeds with operation 304 in which a spacer layer is formed over the dielectric layer and the MTJ stack pillars to adhere to the conductive particles.

The method 300 continues with operation 305 in which the spacer layer is cut off to remove a part of the spacer layer along with the conductive particles to form a plurality of spacers. At operation 305, the spacer layer is "cut off" to form a plurality of spacers. That is, the spacer layer is divided into a plurality of spacers by removing a part of the spacer layer over the dielectric layer so that the spacers over the MTJ stack pillars are physically separated. In addition, as described in operation 304, the spacer layer adheres to the conductive particles over the dielectric layer. The operation of cutting off the spacer layer not only removes a part of the spacer layer over the dielectric layer, but also removes the conductive particles adhered to the spacer layer. Therefore, the MRAM cell-to-cell leakage caused by electrical connection through the conductive particles between the MTJ stack pillars can be alleviated.

In some embodiments, a portion of the dielectric layer between two neighboring MTJ stack pillars of the plurality of MTJ stack pillars and the conductive particles disposed thereon are removed. At operation 305, the operations of removing a part of the spacer layer also removes the conductive particles which are disposed on the dielectric layer and are adhered to the spacer layer. In some cases, some of the conductive particles on the dielectric layer are not directly adhered to the spacer layer but are located between upper layers of the conductive particles and the dielectric layer and may remain on the dielectric layer between neighboring MTJ stack pillars after operation 305. Therefore, to further alleviate the possibility of the occurrence of cell-to-cell leakage between neighboring MTJ stack pillars, the method further includes removing a portion of the dielectric layer between two neighboring MTJ stack pillars. When a portion of the dielectric layer between two neighboring MTJ stack pillars is removed, the conductive particle disposed on the dielectric layer are removed as well.

In some embodiments, a portion of the dielectric layer between two neighboring MTJ stack pillars of the plurality of MTJ stack pillars and the conductive particles disposed thereon are removed by extending duration of cutting off the spacer layer. Removing a portion of the dielectric layer between two neighboring MTJ stack pillars of the plurality of MTJ stack pillars and the conductive particles disposed thereon can be carried out by initiating a different etching operation. However, initiating a different etching operation requires changing a new recipe in the same etch tool for carrying out the etching operation or changing another etch tool to perform a different etching operation. Compared to both of the aforementioned approaches, extending the duration of cutting off the spacer layer helps to save time and the cost for arranging another etch tool or etch recipe. In some embodiments, an isolation layer is formed over the exposed area of the dielectric layer, the spacers and the exposed portion of each of the plurality of MTJ stack pillars. After operation 305, to further alleviate the chance of cell-to-cell leakage between neighboring MTK stack pillars caused by the following operations, for example, thermal treatment, an isolation layer is formed over the exposed area of the dielectric layer, the spacers and the exposed portion of each of the plurality of MTJ stack pillars to keep the MTJ stack pillars isolated from neighboring MTJ stack pillars.

The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method.

Refer to FIG. 4A, FIG. 4B, FIG. 4C, FIG. 4D, FIG. 4E, FIG. 4F and FIG. 4G, which show cross-sectional views of some embodiments of an MRAM device at various stages of fabrication are provided to illustrate the method of FIG. 3.

Figure 4A:
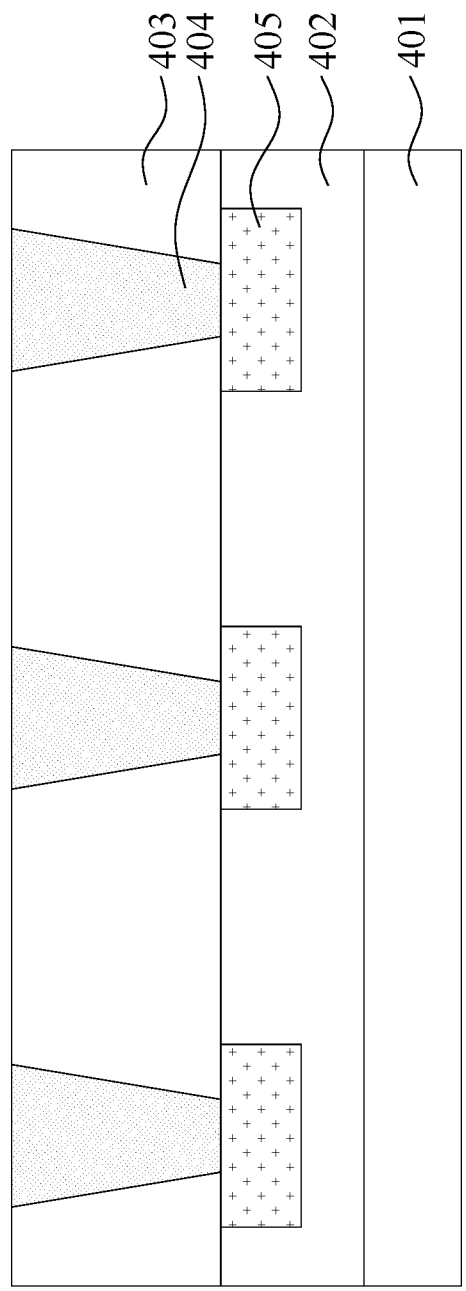
FIGS. 4A to 4G show a series of cross-sectional views of some embodiments of a method of fabricating a magnetoresistive random-access memory (MRAM) device in accordance with some embodiments of the present disclosure.

FIG. 4A illustrates a cross-sectional view of some embodiments corresponding to operation 301. As illustrated by FIG. 4A, a dielectric layer 403 is provided over a substrate 401. In some embodiments, the substrate 401 includes a plurality of transistors (not shown in FIG. 4A), a lower dielectric layer 402, and a lower conductive layer 405 electrically connected to the transistors. In some embodiments, the lower conductive layer 405 is at least partly located within the lower dielectric layer 402. For example, the lower conductive layer 405 may be formed by photolithography patterning, followed by etching the lower dielectric layer 401 to form lower conductive layer openings, and filling the openings to form the lower conductive layer 405. The material of the lower conductive layer 405 includes metal such as copper, tungsten, or aluminum. In some embodiments, the dielectric layer 403 is a single layer. In some embodiments, the dielectric layer 403 includes a plurality of layers of dielectric materials. In some embodiments, a plurality of bottom electrode vias (BEVAs) 404 are formed within the dielectric layer 403. The BEVAs 404 are formed within the dielectric layer 403 by photolithography patterning and etching the dielectric layer 403 to form BEVA openings, and filling the openings with a conductive material to form the BEVAs 404. In some embodiments, the BEVA 404 may include an inverted trapezoid cross-sectional profile, but is not limited thereto. The material of the plurality of BEVAs 404 may include, but is not limited to, metal such as copper, aluminum, gold, or tungsten.

Figure 4B:
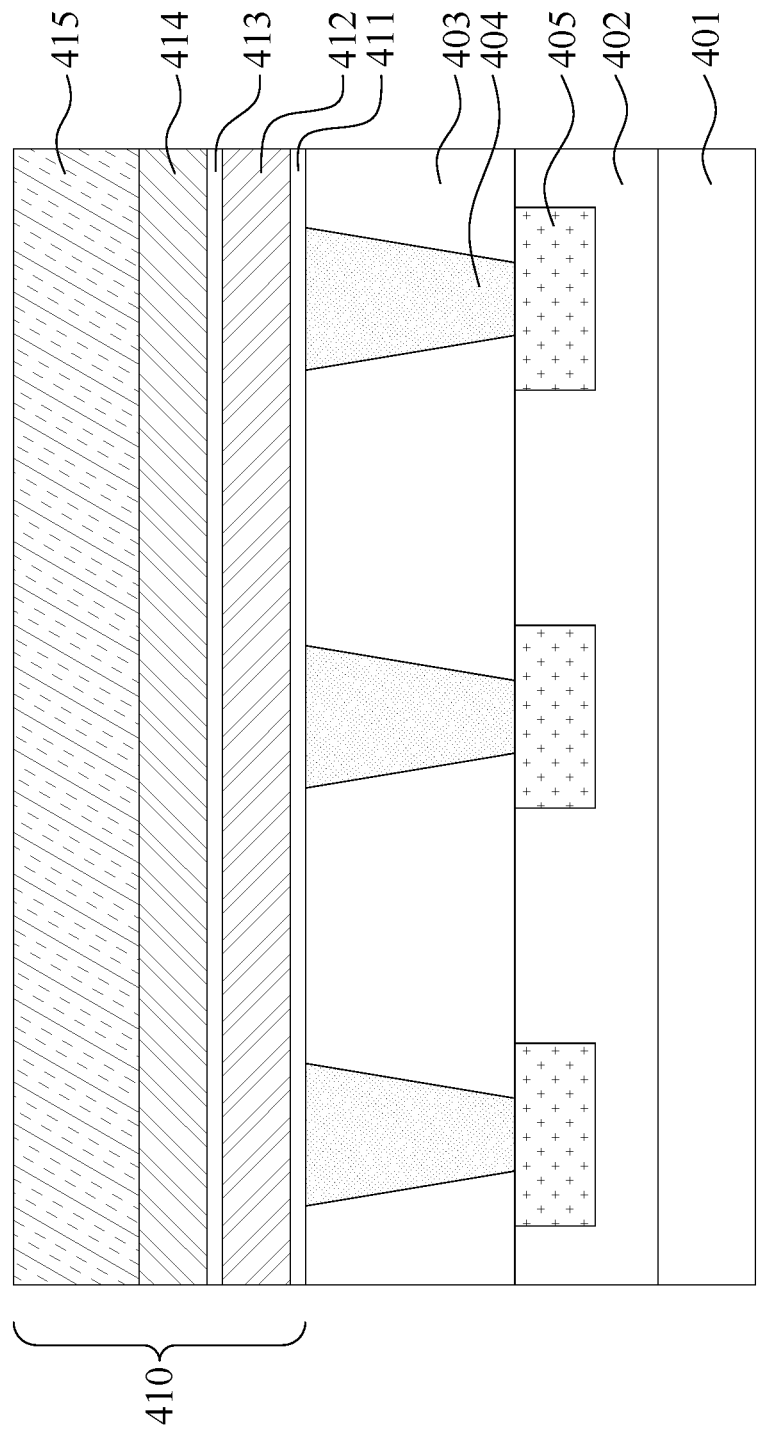

FIG. 4B illustrates a cross-sectional view of some embodiments corresponding to operation 302. As illustrated by FIG. 4B, a magnetic tunnel junction (MTJ) stack 410 is formed over the dielectric layer 403. The MTJ stack includes a bottom electrode layer 411, a first FM layer 412 and a second FM layer 414, an insulating barrier layer 413 and a top electrode layer 415. Though not illustrated in FIG. 4B, the MTJ stack may further include one or more layer(s) such as a dielectric layer or a conductive layer over the top electrode layer 415. Example of the dielectric layer may include, but is not limited to, a tetraethyl orthosilicate (TEOS) layer. The layers of the MTJ stack 410 are formed over the dielectric layer 403 by methods including deposition or spin-coating ("spin-on"). In some embodiments, the deposition method includes chemical vapor deposition (CVD), physical vapor deposition (PVD), metal-organic chemical vapor deposition (MOCVD), and atomic layer deposition (ALD). In some embodiments, CVD includes atmospheric pressure CVD (APCVD), low-pressure CVD (LPCVD), plasma-enhanced CVD (PECVD), microwave plasma-assisted CVD (MPCVD), remote-plasma-enhanced CVD (RPECVD), and low-energy plasma-enhanced CVD (LEPECVD).

The MTJ stack includes at least one conductive material. In some embodiments, the at least one conductive material includes ruthenium (Ru), tantalum (Ta), titanium (Ti), magnesium (Mg), molybdenum (Mo), cobalt (Co), nickel (Ni), iron (Fe), and platinum (Pt). For example, the bottom electrode layer 411 includes a conductive material such as titanium nitride, tantalum nitride, titanium, tantalum, or a combination thereof. The top electrode layer 415 includes a conductive material such as titanium nitride, tantalum nitride, titanium, tantalum, or a combination thereof. The insulating barrier layer 413 includes an oxide, such as a metal oxide. Example of the metal oxide includes, but is not limited to, magnesium oxide. The first FM layer and the second FM layer each may include a conductive material such as cobalt (Co), iron (Fe), tantalum (Ta), platinum (Pt), and molybdenum (Mo) or alloys thereof. In some embodiments, the first FM layer 412 may include, but not limited to, FePt or CoFeB. In some embodiments, the second FM layer 412 may include, but not limited to, Co, Ni, or Ru.

Figure 4C:
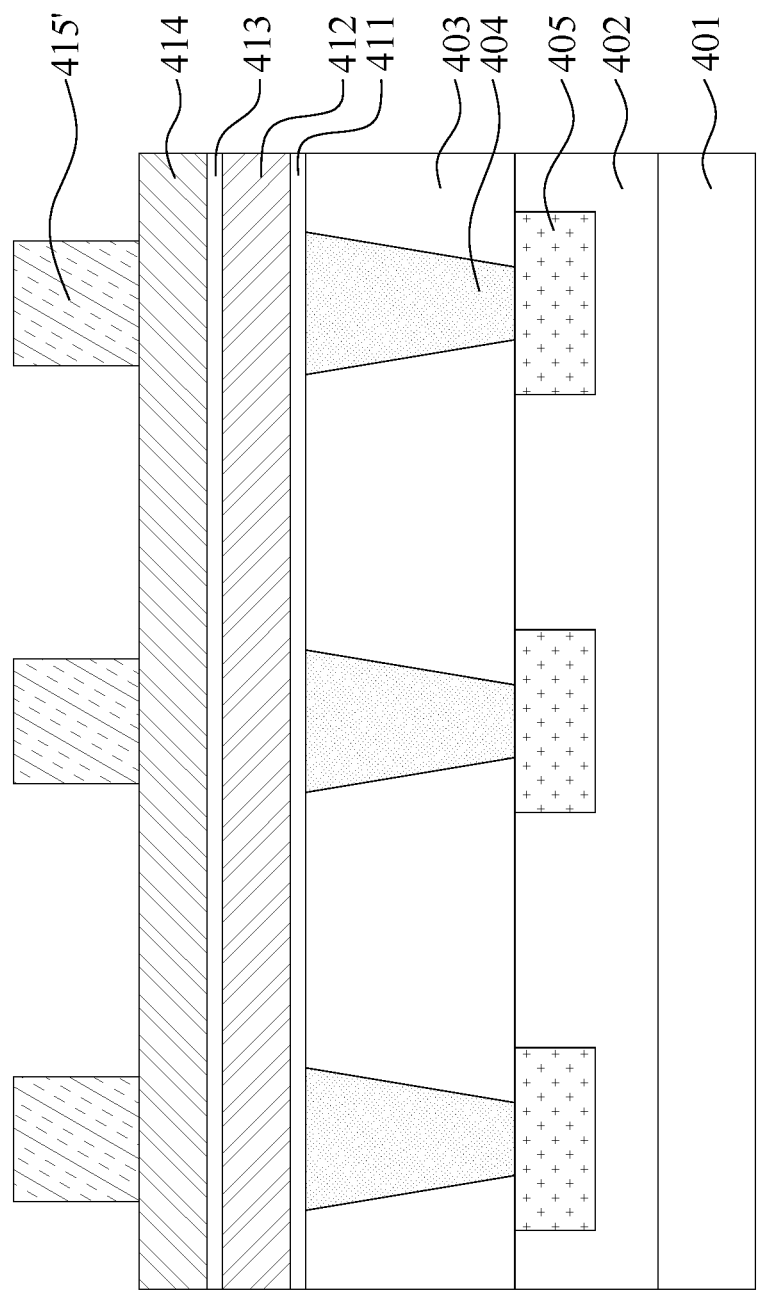
Figure 4D:
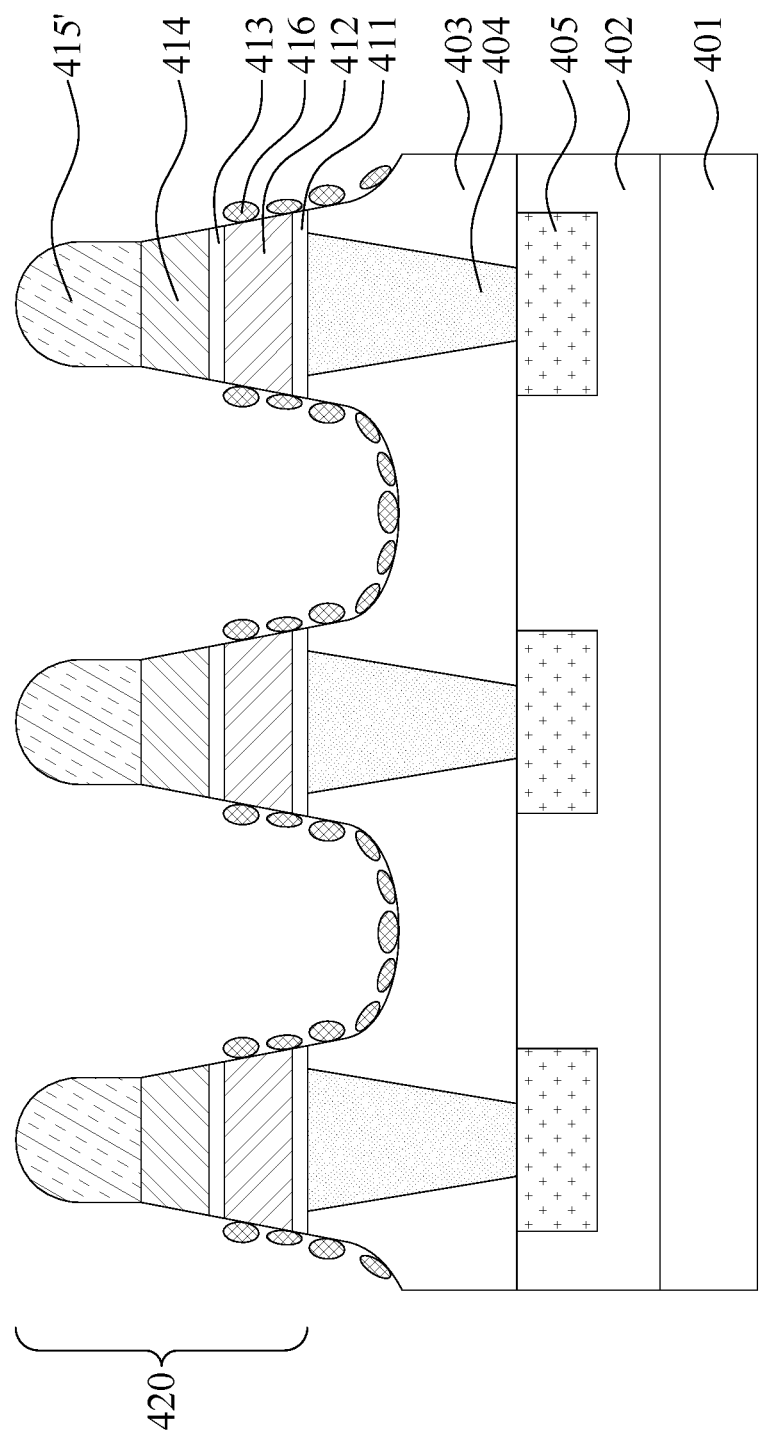

FIG. 4C and FIG. 4D illustrate cross-sectional views of some embodiments corresponding to operation 303. As illustrated by FIGS. 4C and 4D, the MTJ stack is patterned to form a plurality of MTJ stack pillars and expose the dielectric layer with a plurality of conductive particles disposed on the dielectric layer. Referring to FIG. 4C, the operation 303 includes a first operation of defining the pattern of the MTJ stack by photolithography patterning the top electrode layer 415 and etching the top electrode layer 415 to form a top electrode pattern 415'. In some embodiments, the upper portion of the top electrode pattern 415' may include a curved profile such as a spherical profile or the like.

Referring to FIG. 4D, the operation 303 includes a second operation of removing a part of the first FM layer 412, the second FM layer 414, the insulating barrier layer 413 and the bottom electrode layer 411 using the top electrode pattern 415' as a hard mask to form a plurality of MTJ stack pillars 420 with a plurality of conductive particles 416 disposed on the dielectric layer 403. The second operation may be carried out by etching. In some embodiments, etching is carried out by RIE, IBE or ALE. In some embodiments, etching is carried out with an etch gas or a chemical substance selected from argon (Ar), chlorine (Cl), fluorine (F), bromine (Br), iodine (I), helium (He), neon (Ne), krypton (Kr), xenon (Xe), radon (Rn), $Si_xCl_y$, $Si_xF_y$, $Si_xBr_y$, $Si_xI_y$, methanol (MeOH), $CO_x$, $CF_x$, $CBr_x$, $O_2$, $N_2$, $H_2$, and mixtures thereof. In some embodiments, etching is carried out, but not limited to, at a temperature of from 25° C. to 60° C. In some embodiments, etching is carried out, but not limited to, at a radio frequency ("RF") power of lower than 800 watts.

In some embodiments, the critical dimension of the insulating barrier layer 413 of each of the MTJ stack pillars 420 is within the range of 30 nm to 60 nm. In some embodiments, the pitch between two neighboring MTJ stack pillars 420 is within the range of 70 nm to 180 nm. In some embodiments, the MTJ stack pillar 420 has a pillar height within the range of 500 angstroms to 850 angstroms. In some embodiments, the remained top electrode has a top electrode height within the range of 200 angstroms to 450 angstroms.

The conductive particles 416 include the materials of the first FM layer 412 and the second FM layer 414, the insulating barrier layer 413 and/or the top electrode layer 415. As described above, during operation 303, a part of the MTJ stack 410 is removed by, for example, etching, which leads to the creation of the conductive particles 416 depositing along the sidewalls of the MTJ pillars 420 and on the dielectric layer 403. Because of the dense distribution of the MTJ pillars 420 and their high aspect ratio, the conductive particles deposited on the sidewalls of the MTJ pillars 420 and on the dielectric layer 403 may not be easily removed by etching process due to the "shadowing effect." That is, the conductive particles are shadowed by the MTJ stack pillars 420 from being removed by chemical reaction or ion bombardment to vaporize the conductive particles 416. The conductive particles 416, if distributed continuously over the sidewalls of the MTJ pillars 420 and on the dielectric layer 403 between neighboring MTJ pillars 420, lead to an undesired electrical connection, i.e., "leakage," between neighboring MTJ pillars 420.

Figure 4E:
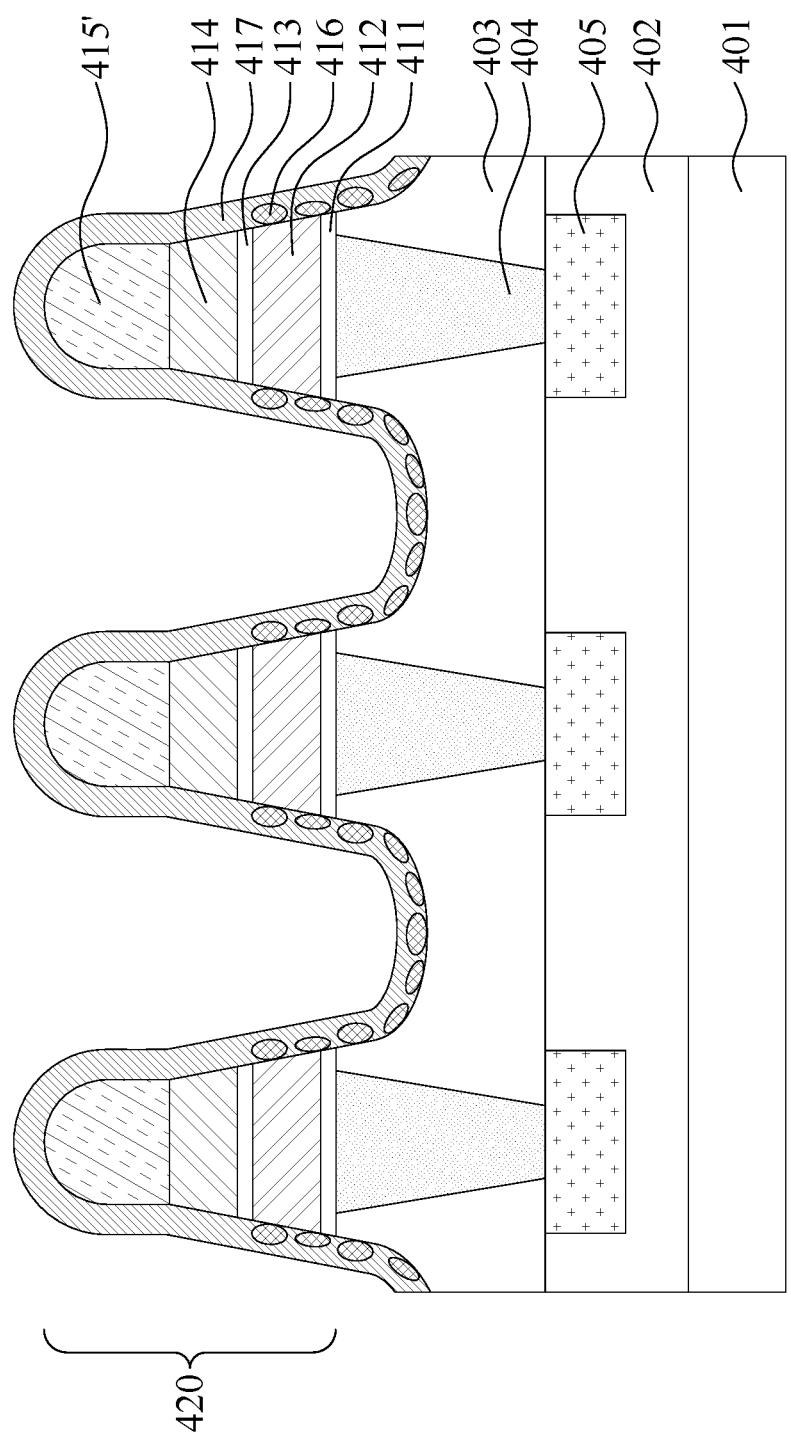

Referring to FIG. 4E, FIG. 4E illustrates a cross-sectional view of some embodiments corresponding to operation 304. As illustrated by FIG. 4E, a spacer layer 417 is formed over the dielectric layer 403 and the MTJ pillars 420 to adhere to the conductive particles 416. In some embodiments, the spacer layer 417 includes an insulating material such as SiN, SiCN, SiON or mixtures thereof. The spacer layer 417 serves as a glue layer to adhere to the conductive particles 416 and confine the conductive particles to the position where the conductive particles located on the MTJ pillars 420 or the dielectric layer 403.

In some embodiments, the spacer layer 417 is formed over the dielectric layer 403 and the MTJ pillars 420 by methods including deposition or spin-coating ("spin-on"). In some embodiments, the deposition method includes chemical vapor deposition (CVD), physical vapor deposition (PVD), metal-organic chemical vapor deposition (MOCVD), and atomic layer deposition (ALD). In some embodiments, CVD includes atmospheric pressure CVD (APCVD), low-pressure CVD (LPCVD), direct plasma-enhanced CVD (Direct PECVD), microwave plasma-assisted CVD (MPCVD), remote-plasma-enhanced CVD (Remote PECVD), and low-energy plasma-enhanced CVD (LEPECVD). In some embodiments, the deposition is carried out at a temperature of from 25° C. to 300° C. In some embodiments, the spacer layer 417 is deposited on the dielectric layer 403 and the MTJ stack pillars 420 for a thickness of 300 angstroms to 700 angstroms. As illustrated in FIG. 4E, the spacer layer 417 is continuously formed on the dielectric layer 403 and the MTJ stack pillars 420.

Figure 4F:
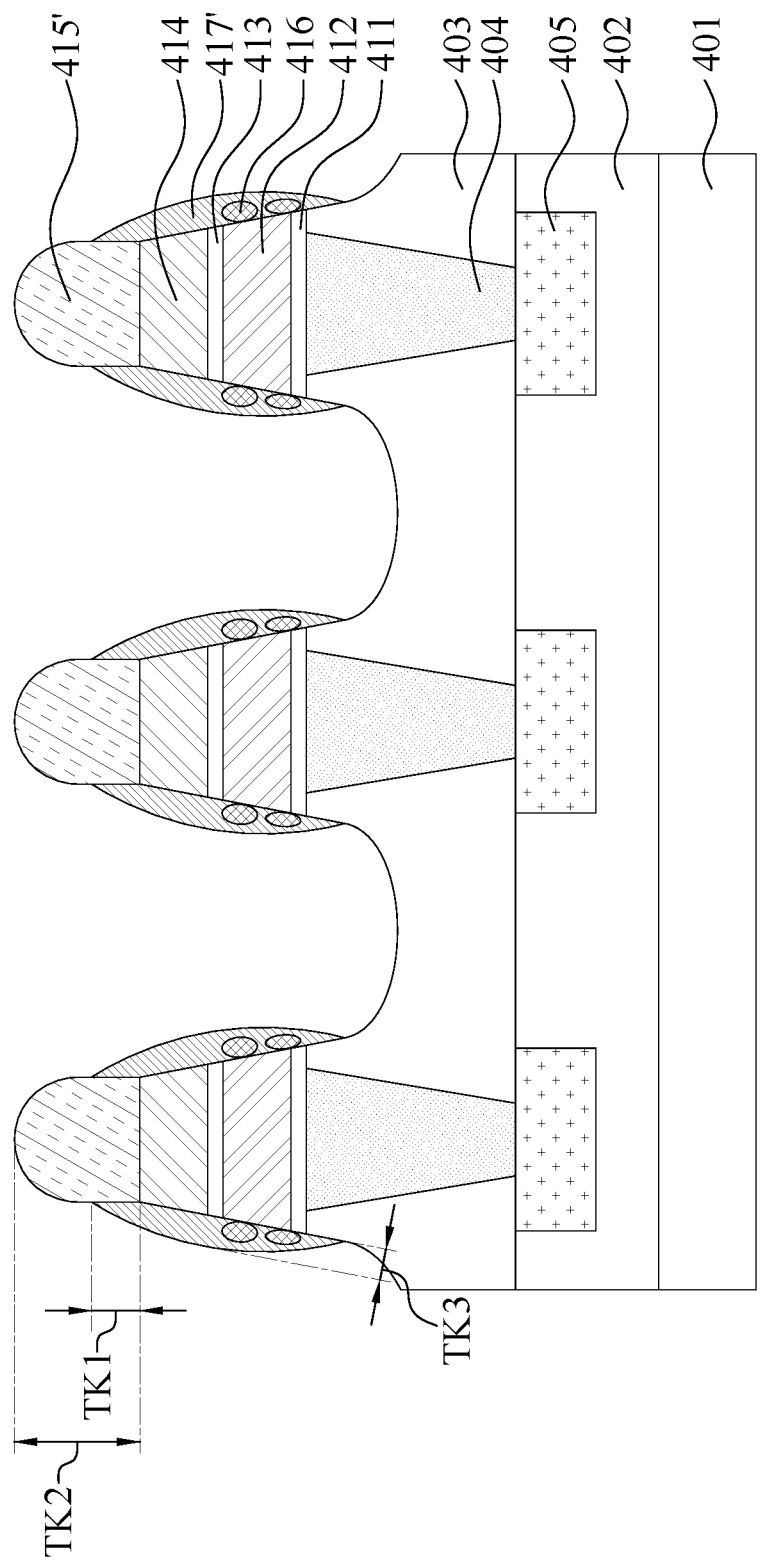

Referring to FIG. 4F, FIG. 4F illustrates a cross-sectional view of some embodiments corresponding to operation 305. As illustrated by FIG. 4F, the spacer layer 417 is cut off to remove a part of the spacer layer 417 along with the conductive particles 416 adhered to the spacer layer 417 and to form a plurality of spacers 417'. The term "cut off" refers to the physical disconnection of the spacers 417 between neighboring MTJ stack pillars 420.

Referring back to FIG. 4E, during operation 304, the spacer layer 417 is continuously formed over the dielectric layer 403 and the MTJ pillars 420 to adhere to the conductive particles 416. After operation 305, the spacers 417' between neighboring MTJ stack pillars 420 are physically separated, and the conductive particles 416 disposed on the dielectric layer 403 and adhered to the spacer layer 417 are removed as well. In addition, the conductive particles 416 adhered to the spacers 417' are confined at their original position so as to alleviate the chance of the conductive particles 416 falling down to the dielectric layer 403 between neighboring MTJ stack pillars 420. The physical disconnection between spacers 417' on neighboring MTJ stack pillars 420 is achieved by removing a part of the spacer layer 417 by, for example, an etching operation. The etching operation may be carried out by RIE, IBE and ALE. In some embodiments, the etch operation is carried out at a temperature of from 25° C. to 60° C.

Referring to FIG. 4F again, in some embodiments, during operation 305, after the spacer layer 417 is cut off, a portion of the dielectric layer 403 between two neighboring MTJ stack pillars 420 and the conductive particles 416 disposed on the dielectric layer 403 may be further removed. In some embodiments, the removal of a portion of the dielectric layer 403 between two neighboring MTJ stack pillars 420 and the conductive particles 416 disposed on the dielectric layer 403 is carried out by extending the duration of the operation to cut off the spacer layer. As described above, in some cases, some of the conductive particles 416 on the dielectric layer 403 are not directly adhered to the spacer layer 417 but are located between upper layers of the conductive particles 416 and the dielectric layer 417 and may remain on the dielectric layer 403 between neighboring MTJ stack pillars 420 after operation 305. Therefore, to further alleviate the possibility of the occurrence of cell-to-cell leakage between neighboring MTJ stack pillars 420, the method further includes removing a portion of the dielectric layer 403 between two neighboring MTJ stack pillars 420. When a portion of the dielectric layer 403 between two neighboring MTJ stack pillars 420 is removed, the conductive particles 416 disposed on the dielectric layer 403 are removed as well.

Referring to FIG. 4F, after operation 305, the upper portion of the top electrode pattern 415' is exposed and the lower portion is surrounded by the spacer 417'. In some embodiments, the lower portion of the top electrode pattern 415' has a vertical height TK1 of 50 angstroms to 200 angstroms. The top electrode pattern 415' has a top electrode total height from 100 angstroms to 300 angstroms. The ratio of TK1 to TK2 is from 1:1.5 to 1:6. In some embodiments, the spacer 417' over the MTJ stack pillars 420 has a spacer side wall thickness TK3 of 20 angstroms to 300 angstroms. The spacer side wall thickness TK3 is measured in a direction perpendicular to the surface of the spacers 417'.

Figure 4G:
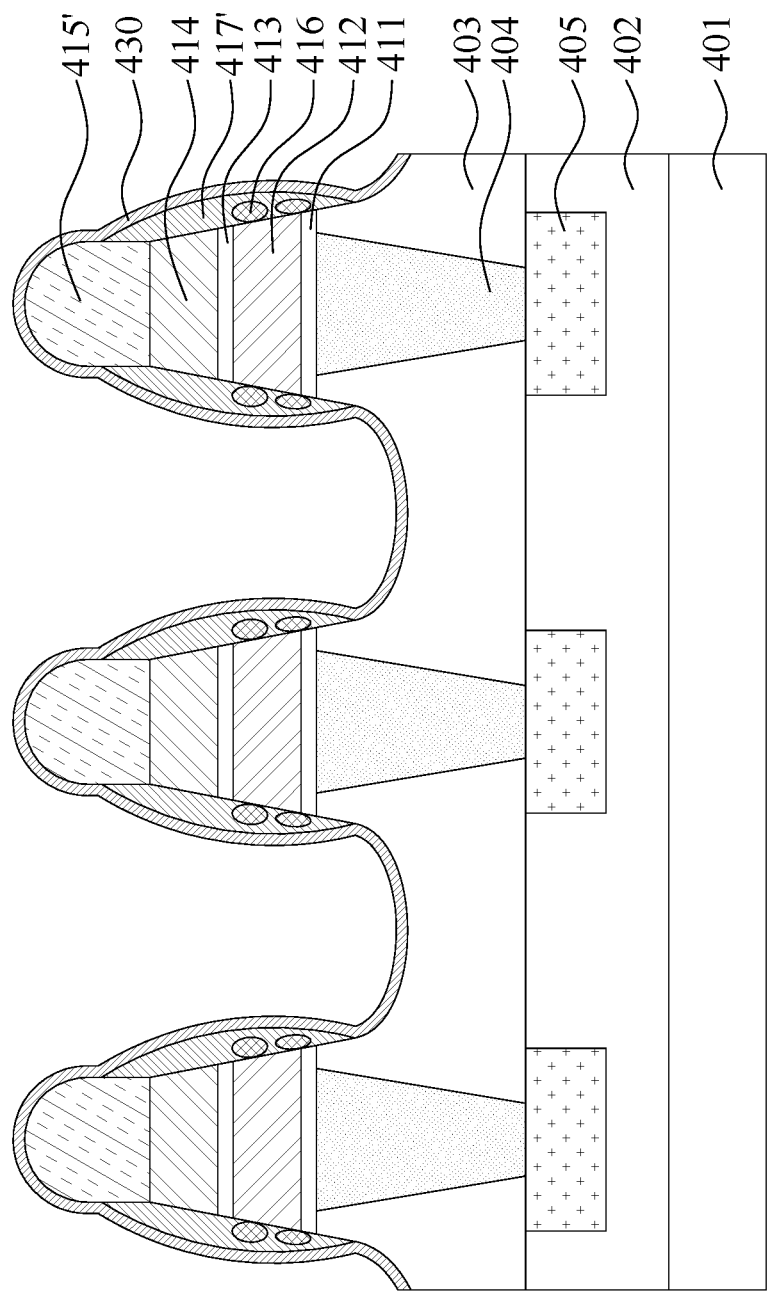

Referring to FIG. 4G, FIG. 4G illustrates a schematic cross-sectional view of an integrated circuit structure in accordance with some embodiments of the present disclosure. In some embodiments, an isolation layer 430 is formed over the exposed area of the dielectric layer 403, the spacers 417' and the exposed portion of the MTJ stack pillars 420. In some embodiments, the isolation layer 430 includes a dielectric material, such as a high-K dielectric layer.

Figure 5:
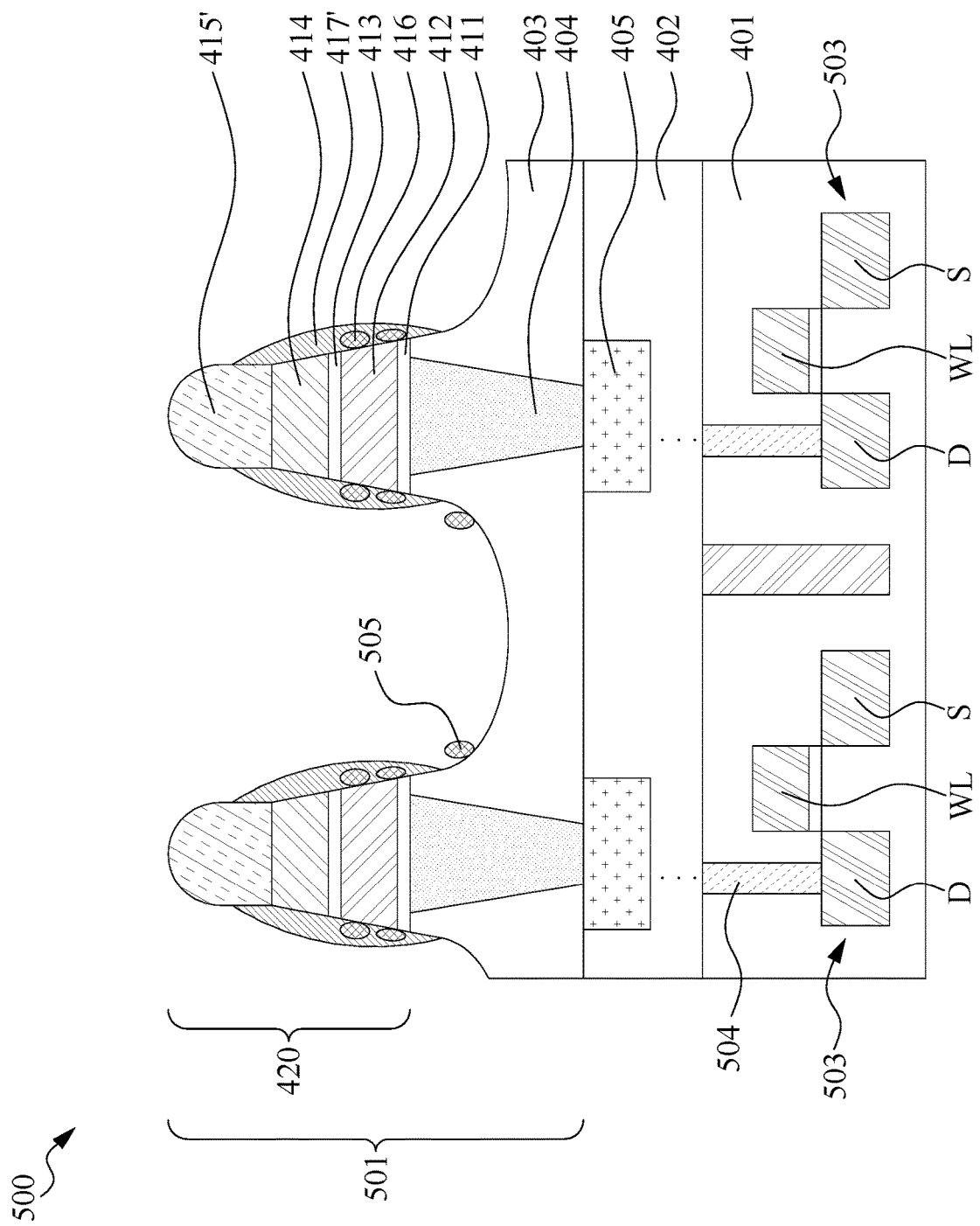
FIG. 5 shows a schematic cross-sectional view of an integrated circuit/MRAM device in accordance with some embodiments of the present disclosure.
Figure 6:
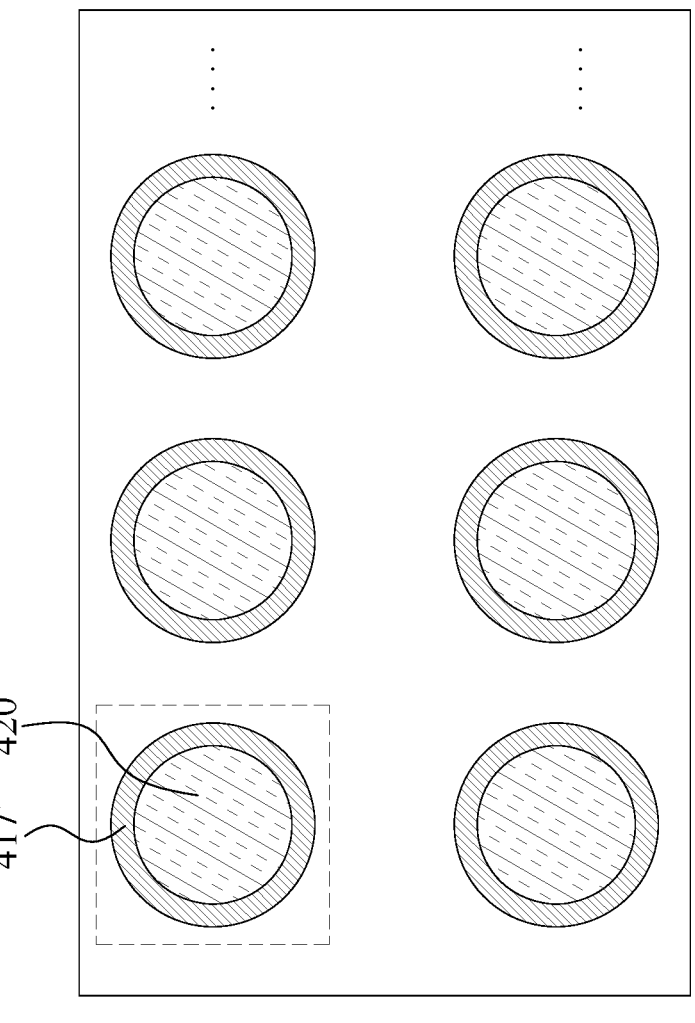
FIG. 6 illustrates a top view of the integrated circuit/MRAM device of FIG. 5 in accordance with some embodiments of the present disclosure.

Referring to FIG. 5 and FIG. 6, FIG. 5 illustrates a schematic cross-sectional view of an integrated circuit/MRAM device in accordance with some embodiments of the present disclosure, and FIG. 6 illustrates a top view of the integrated circuit/MRAM device of FIG. 5 in accordance with some embodiments of the present disclosure. The integrated circuit 500 includes a substrate 401, a dielectric layer 403 over the substrate 101, a plurality of cells 501, a plurality of spacers 417' and a plurality of conductive particles 416. Each of the plurality of cells 501 includes a bottom portion in the dielectric layer 403 and an upper portion protruding from the dielectric layer 403. In some embodiments, the bottom portion may include the BEVA 404, and the upper portion may include the MTJ stack pillar 420. The plurality of spacers 417' are disposed over the dielectric layer 403 and partially cover the upper portions of the cells 501, respectively. The spacers 417' are disconnected from each other, and the spacers 417' cover a first area of the dielectric layer 403 and expose a second area of the dielectric layer 403. The plurality of conductive particles 416 are disposed between the first area of the dielectric layer 403 and the spacers 417'. The cells 501 are electrically connected to transistors 503 within the substrate 401 by an interconnect structure 504. The interconnect structure includes a plurality of metal layers and vias, which includes the lower conductive layer 405. As shown in FIG. 6, in the integrated circuit/MRAM device 500, the upper portions of the cells 501 are arranged in arrays and are surrounded by the spacers 417'.

In some embodiments, the conductive particles 416 are disposed in the second area of the dielectric layer 403, and electrically disconnected from each other. In some embodiments, the second area of the dielectric layer 403 between two neighboring cells of the plurality of cells 501 has a curved profile. The curved profile of the dielectric layer 403 is formed by removing a part of the dielectric layer 403. In some embodiments, the removing operation is carried out by etching.

Figure 7:
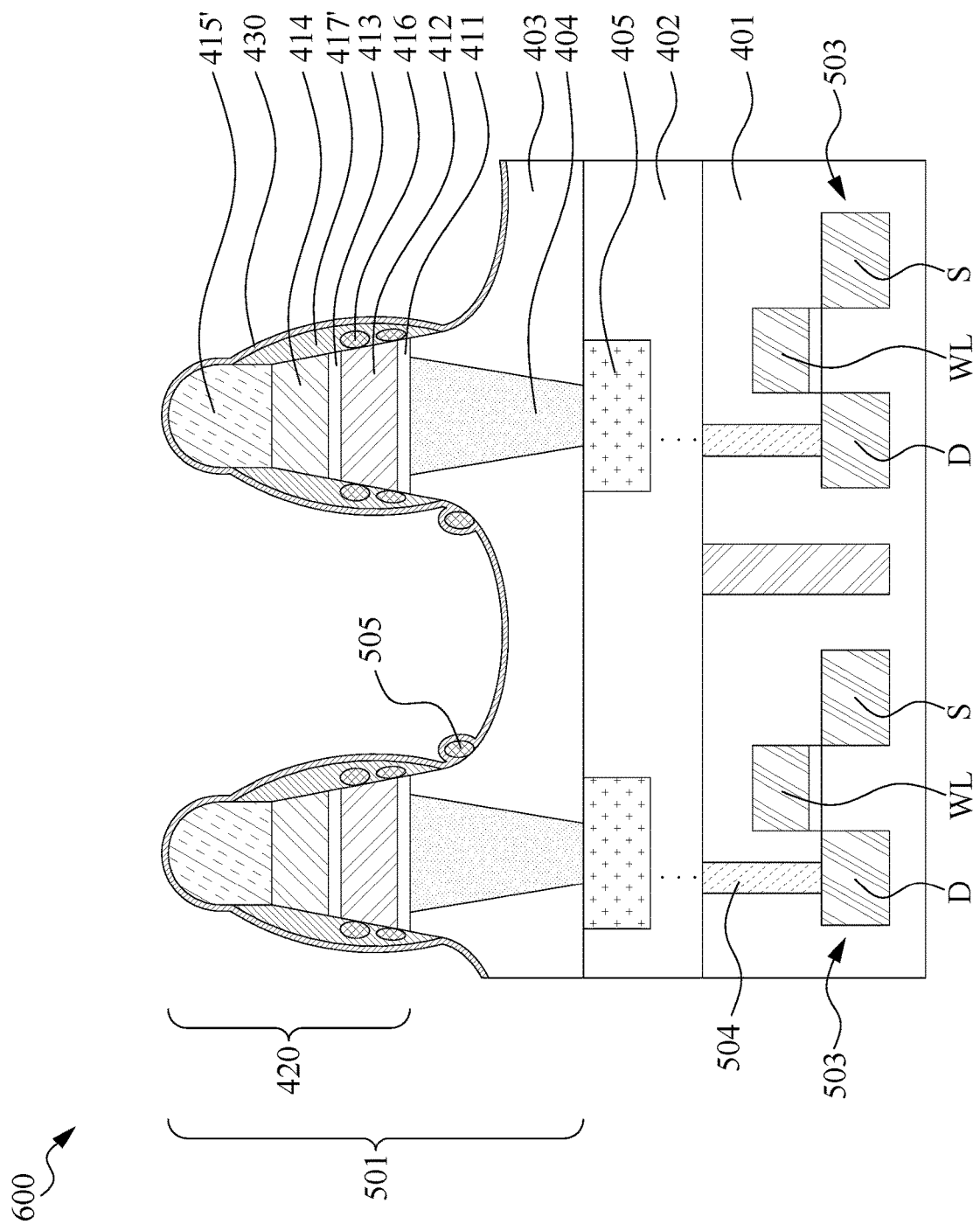
FIG. 7 shows a schematic cross-sectional view of an integrated circuit/MRAM device in accordance with some embodiments of the present disclosure.

Referring to FIG. 7, FIG. 7 illustrates a schematic cross-sectional view of an integrated circuit/MRAM device in accordance with some embodiments of the present disclosure. In some embodiments, the integrate circuit 600 further includes an isolation layer 430. The isolation layer 430 covers the second area of the dielectric layer 403, the spacers 417' and the upper portions of the cells 501 exposed by the spacers 417'. In some embodiments, the isolation layer 430 includes a dielectric material. In some embodiments, the dielectric material includes a high-K dielectric material. In some embodiments, the high-K dielectric material has a dielectric constant higher than about 3.9.

In some embodiments, the integrated circuit 500 or 600 is a magnetoresistive random-access memory (MRAM) device including a dielectric layer 403 over a substrate 401, a plurality of magnetic tunnel junction (MTJ) stack pillars 420, a plurality of spacers 417', and a plurality of first conductive particles 416. The MTJ stack pillars 420 are disposed over the dielectric layer 403. The MTJ stack pillars 420 include at least one conductive material. The plurality of spacers 416 are disposed over the dielectric layer 403. The plurality of spacers 417' partially cover the MTJ stack pillars 420, respectively. The spacers 417' are disconnected from each other. The spacers 417' cover a first area of the dielectric layer and expose a second area of the dielectric layer. The plurality of first conductive particles 416 are disposed between the first area of the dielectric layer 403 and the spacers 417'. The first conductive particles 416 include the at least one conductive material.

In some embodiments, the MRAM device further includes a plurality of second conductive particles 505 discontinuously disposed in the second area of the dielectric layer 403. In some embodiments, the second conductive particles 505 include the at least one conductive material. In some embodiments, the second area of the dielectric layer between two neighboring MTJ stack pillars 420 has a curved profile. In some embodiments, the MRAM device further includes an isolation layer 430 covering the second area of the dielectric layer 403, the spacers 417' and an area of each of the plurality of MTJ stack pillars 420 exposed by the spacers 417'. In some embodiments, the isolation layer 430 is substantially conformal with respect to profiles of the MTJ stack pillars 420. In some embodiments, the conductive material includes ruthenium (Ru), tantalum (Ta), titanium (Ti), magnesium (Mg), molybdenum (Mo), cobalt (Co), iron (Fe), or mixtures thereof.

Accordingly, the present disclosure therefore provides an integrated circuit/an MRAM device and a method for forming the same. In some embodiments, by cutting off the spacer layer formed over the dielectric layer of the integrated circuit/MRAM device, a part of the spacer layer between two neighboring cells/MTJ stack pillars is removed, and the conductive particles disposed on the dielectric layer and adhered to the spacer layer are removed as well. Consequently, the possibility of the occurrence of cell-to-cell leakage between neighboring cells/MTJ stack pillars of the integrated circuit/MRAM device is alleviated, and thus reliability and yield of the integrated circuit and MRAM device are improved.

In some embodiments, an integrated circuit is provided. The integrated circuit includes a substrate, a dielectric layer, a plurality of cells, a plurality of spacer, and plurality of conductive particles. The dielectric layer is disposed over the substrate. Each of the cells includes a bottom portion in the dielectric layer and an upper portion protruding from the dielectric layer. The spacers are disposed over the dielectric layer and partially cover the upper portions of the cells, respectively. The spacers are disconnected from each other and the spacers cover a first area of the dielectric layer and expose a second area of the dielectric layer. The conductive particles are disposed between the first area of the dielectric layer and the spacers.

In some embodiments, a magnetoresistive random-access memory (MRAM) device is provided. The MRAM device includes a dielectric layer, a plurality of magnetic tunnel junction (MTJ) stack pillars, a plurality of spacers, and a plurality of first conductive particles. The dielectric is disposed over a substrate. The MTJ stack pillars are disposed over the dielectric layer. The MTJ stack pillars include at least one conductive material. The spacers are disposed over the dielectric layer and partially cover the MTJ stack pillars, respectively. The spacers are disconnected from each other. The spacers cover a first area of the dielectric layer and expose a second area of the dielectric layer. The first conductive particles are disposed between the first area of the dielectric layer and the spacers. The first conductive particles include the at least one conductive material.

In some embodiments, a method of fabricating a magnetoresistive random-access memory (MRAM) device is provided. The method includes following operations. A dielectric layer is provided over a substrate. A magnetic tunnel junction (MTJ) stack including at least one conductive material is formed over the dielectric layer. The MTJ stack is patterned so that a plurality of MTJ stack pillars are formed and the dielectric layer is exposed with a plurality of conductive particles disposed on the dielectric layer. A spacer layer over the dielectric layer and the MTJ stack pillars to adhere to the conductive particles is formed. The spacer layer is cut off to remove a part of the spacer layer and the conductive particles and form a plurality of spacers.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
    a substrate;
    a dielectric layer over the substrate;
    a plurality of cells each comprising a bottom portion in the dielectric layer, and an upper portion protruding from the dielectric layer;
    a plurality of spacers over the dielectric layer and partially covering the upper portions of the cells, respectively, wherein the spacers are disconnected from each other, and the spacers cover a first area of the dielectric layer and expose a second area of the dielectric layer; and
    a plurality of conductive particles between the first area of the dielectric layer and the spacers.

2. The integrated circuit of claim 1, wherein the conductive particles are disposed in the second area of the dielectric layer, and electrically disconnected from each other.

3. The integrated circuit of claim 1, wherein the second area of the dielectric layer between two neighboring cells of the plurality of cells has a curved profile.

4. The integrated circuit of claim 1, further comprising an isolation layer covering the second area of the dielectric layer, the spacers and the upper portions of the cells exposed by the spacers.

5. The integrated circuit of claim 4, wherein the isolation layer comprises a dielectric material.

6. The integrated circuit of claim 1, wherein the upper portion of each of the plurality of cells comprises a magnetic tunnel junction (MTJ).

7. The integrated circuit of claim 6, wherein the MTJ comprises at least one conductive material.

8. The integrated circuit of claim 7, wherein the conductive particles comprises the at least one conductive material.

9. The integrated circuit of claim 8, wherein the conductive material comprises Ru, Ta, Ti, Mo, Co, Mg, Fe, or mixtures thereof.

10. A magnetoresistive random-access memory (MRAM) device, comprising:
    a dielectric layer over a substrate;
    a plurality of magnetic tunnel junction (MTJ) stack pillars over the dielectric layer, wherein the MTJ stack pillars comprise at least one conductive material;
    a plurality of spacers over the dielectric layer and partially covering the MTJ stack pillars, respectively, wherein the spacers are disconnected from each other, and the spacers cover a first area of the dielectric layer and expose a second area of the dielectric layer; and a plurality of first conductive particles between the first area of the dielectric layer and the spacers, wherein the first conductive particles comprise the at least one conductive material.

11. The MRAM device of claim 10, further comprising a plurality of second conductive particles discontinuously disposed in the second area of the dielectric layer.

12. The MRAM device of claim 11, wherein the second conductive particles comprise the at least one conductive material.

13. The MRAM device of claim 11, wherein the second area of the dielectric layer between two neighboring MTJ stack pillars of the plurality of MTJ stack pillars has a curved profile.

14. The MRAM device of claim 10, further comprising an isolation layer covering the second area of the dielectric layer, the spacers and an area of each of the plurality of MTJ stack pillars exposed by the spacers.

15. The MRAM device of claim 14, wherein the isolation layer is substantially conformal with respect to profiles of the MTJ stack pillars.

16. The MRAM device of claim 10, wherein the conductive material comprises Ru, Ta, Ti, Mo, Mg, Co, Fe, or mixtures thereof.

17. A method of fabricating a magnetoresistive random-access memory (MRAM) device, comprising:
providing a dielectric layer over a substrate;
forming a magnetic tunnel junction (MTJ) stack over the dielectric layer, wherein the MTJ stack comprises at least one conductive material;
patterning the MTJ stack to form a plurality of MTJ stack pillars and expose the dielectric layer with a plurality of conductive particles disposed on the dielectric layer;
forming a spacer layer over the dielectric layer and the MTJ stack pillars to adhere to the conductive particles; and
cutting off the spacer layer to remove a part of the spacer layer along with the conductive particles to form a plurality of spacers.

18. The method of claim 17, further comprising removing a portion of the dielectric layer between two neighboring MTJ stack pillars of the plurality of MTJ stack pillars and the conductive particles disposed thereon.

19. The method of claim 18, wherein removing a portion of the dielectric layer between two neighboring MTJ stack pillars of the plurality of MTJ stack pillars and the conductive particles disposed thereon is carried out by extending duration of cutting off the spacer layer.

20. The method of claim 18, further comprising forming an isolation layer over the exposed area of the dielectric layer, the spacers and an exposed portion of each of the plurality of MTJ stack pillars.

* * * * *